(12) United States Patent
Omori et al.

(10) Patent No.: US 7,386,025 B2
(45) Date of Patent: Jun. 10, 2008

(54) SURFACE EMITTING SEMICONDUCTOR LASER ARRAY AND OPTICAL TRANSMISSION SYSTEM USING THE SAME

(75) Inventors: Seiya Omori, Kanagawa (JP); Akira Sakamoto, Kanagawa (JP); Yasuaki Miyamoto, Kanagawa (JP); Masahiro Yoshikawa, Kanagawa (JP); Kohtaro Handa, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 129 days.

(21) Appl. No.: 11/261,645

(22) Filed: Oct. 31, 2005

(65) Prior Publication Data

US 2006/0227836 A1    Oct. 12, 2006

(30) Foreign Application Priority Data

Apr. 8, 2005   (JP)   ............... 2005-112405

(51) Int. Cl.
    *H01S 5/00*   (2006.01)
(52) U.S. Cl. ............... 372/50.12; 372/50.124
(58) Field of Classification Search ............ 372/50.1, 372/50.11, 50.12, 50.124, 46.01, 46.011–46.016
    See application file for complete search history.

(56) References Cited

U.S. PATENT DOCUMENTS 5,561,683 A * 10/1996 Kwon ............... 372/96
6,272,160 B1 * 8/2001 Stronczer ............ 372/38.02
2003/0031218 A1 * 2/2003 Yeh ............... 372/45
2004/0213310 A1 * 10/2004 Otoma ............... 372/45

FOREIGN PATENT DOCUMENTS

| JP | A 10-52941 | 2/1998 |
| JP | A 10-65266 | 3/1998 |
| JP | A 2004-23087 | 1/2004 |
| KR | 0131920 | 4/1998 |

* cited by examiner

*Primary Examiner*—Minsun Harvey
*Assistant Examiner*—Xnning Niu
(74) *Attorney, Agent, or Firm*—Oliff & Berridge, PLC

(57) ABSTRACT

A surface emitting semiconductor laser array includes multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions. At least one of the multiple light-emitting portions has a near field pattern different from those of other light-emitting portions.

14 Claims, 21 Drawing Sheets

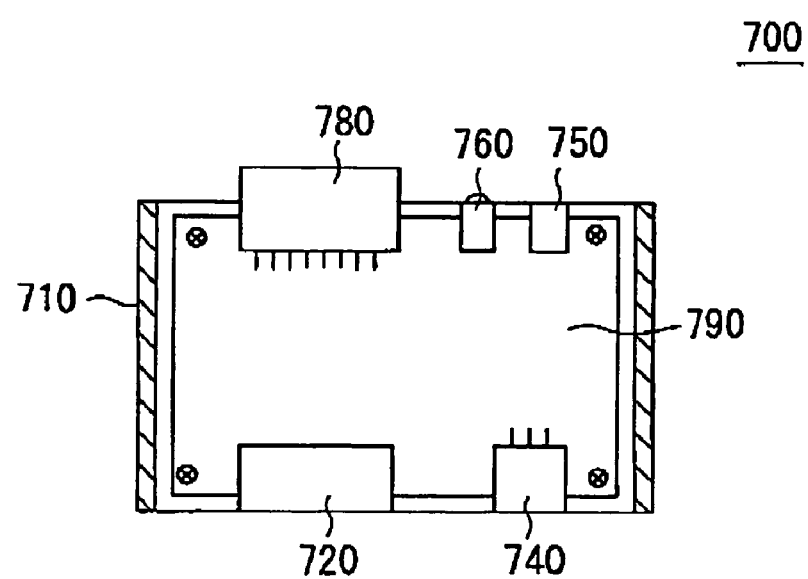
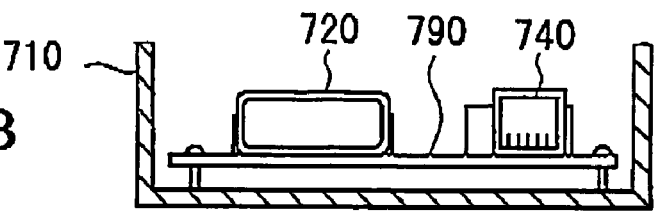
Fig. 17A
Fig. 17B

SURFACE EMITTING SEMICONDUCTOR LASER ARRAY AND OPTICAL TRANSMISSION SYSTEM USING THE SAME

BACKGROUND OF THE INVENTION

1. Field of the Invention

The present invention relates to a surface emitting semiconductor laser array applicable to light sources of optical interconnections, optical memories, optical switches, optical information processing, laser beam printing machines and copying machines, and an optical transmission system using the array.

2. Description of the Related Art

A vertical cavity surface emitting laser diode (hereinafter referred to as VCSEL) is an optical device that has a resonator formed in the direction vertical to the semiconductor substrate, and emits light in this vertical direction. Multiple VCSELs are attractive as parallel-arranged optical sources that can be arranged in a one-dimensional or two-dimensional array in highly integrated fashion.

In VCSEL, the carrier and light are confined in the vertical cavity in order to efficiently emit laser light. There are several means for realizing a confinement structure in the horizontal direction of the substrate, and examples of these means are typically of air post type, selective oxidization type, proton projection type and proton reflection type. The air post type has a slender post on the substrate and the post itself functions as a current path. In the selective oxidization type, a post structure is formed on the substrate, and a part of an AlAs layer called a control layer is oxidized so that a limited current path can be formed. In the proton type, a limited current path is formed by defining an insulation region by proton implantation. The selectively oxidization type of VCSEL among the various types of VCSELs has a low threshold current and excellent light-current characteristics. Thus, there is considerable activity in the reduction to practice.

Japanese Patent Application Publication 2004-23087 discloses a VCSEL in which the side surfaces of a contact layer, an upper multi-layered film reflection mirror and a current confinement portion are aligned with a metal contact layer provided on the tope of the mesa. This arrangement improves the precision in alignment of the metal contact layer having a light-emitting aperture with the current confinement portion, and realizes improved optical output although laser oscillation is in the fundamental lateral mode.

The light source of special transmission needs comparatively large power. Thus, a VCSEL of multi-spot type is used in which multiple light-emitting units (multiple spots) serving as parallel-arranged light sources are formed on the substrate. The multiple spots are driven by identical drive signals from a drive circuit, and laser lights emitted from the multiple spots are combined.

Japanese Patent Application Publication No. 10-65266 discloses a VCSEL in which at least one of upper and lower semiconductor multi-layered reflection mirrors is made longer than the other in a direction on the plane of the semiconductor substrate so that the emitted beam has a directional intensity pattern. This application describes a laser device, as exemplarily shown in FIG. 20, in which the VCSELs are one-dimensionally or two-dimensionally arrayed so that the short axes of light emission patterns having a rectangular or oval shape are aligned in a direction of n. This makes it possible to realize uniform light emission.

Japanese Patent Application No. 10-52941 discloses a light source, as exemplarily shown in FIG. 21, in which light sources are arrayed so that the light emission apertures (near field pattern sizes) become smaller from the center of the main scan direction Y towards opposing ends of the array. The light beams emitted from the light sources in the center form an image at a focusing point on the plane of a photosensitive member. In contrast, the light beams emitted from the light sources in the ends form an image at a focusing point short of the photosensitive member, and gradually become thick. Then, these beams form a spot size as large as the spot size available in the center on the plane of the photosensitive member.

However, the above-mentioned multi-spot type VCSELs have the following drawbacks. FIG. 22 schematically shows two adjacent light-emitting portions of the conventional multi-spot type VCSEL. Referring to this figure, on an n-type semiconductor substrate 910, provided are an n-type lower reflection mirror 911, an active layer 912, a p-type current funneling portion 913, and a p-type upper reflection mirror laminated in this order. A p-side electrode layer 915 is formed on the laminate. Cylindrical posts (mesas) 916 are formed on the substrate, and include the upper reflection mirror 914, the current funneling portion 913, the active layer 912 and the lower reflection mirror 911. A selectively oxidized region 913a is formed in an outer peripheral portion of the current funneling portion 913 in each post 916. The remaining non-oxidized portion is an aperture 913b that has a circular shape and a conductive region. The p-side electrode layer 915 has circular light emission apertures 917, which are respectively aligned with the centers of C1 and C2 of the apertures 913b in the axial directions. An n-side electrode 918, which is provided common to the posts (light-emitting portions) 916, is provided on the backside of the semiconductor substrate 910.

When the VICSEL is driven, laser lights having a divergence angle θ with respect to the center axes C1 and C2 are emitted from the substrate 910 in the vertical direction in accordance with the diameters of the apertures 913b and those of the light-emission apertures 917 in the electrode layer 915. At that time, near field patterns (NFP) 920 in the light-emission apertures 917 of the posts 916 have symmetrical single peaks, and a near field profile 921 of the combined laser beam has a portion 922 in which power is reduced. This is because there is a difficulty in close arrangement of the posts 916 over a given interval due to fabrication limitations. The power-reduced portion 922 is not good in optical systems over which light is transmitted.

When laser light is incident to a light slit, a lens and a light-receiving element, the divergence angle of the laser light is preferably stable and narrow. The single-spot VCSEL may easily meet the above requirement. In contrast, the multi-spot type laser array has difficulty in reduction of the spot intervals over the given distance due to the fabrication limitations as described above. The light-emitting points of the laser lights are spatially spread, and the divergence angle of the combined laser beam has difficulty in narrowing as much as that of the single-spot. Especially, the laser beams from the posts (light-emitting portions) located in the array ends are made dark through an optical member such as a lens. This makes it difficult to reduce the divergence angles of the laser beams from the array ends.

The emission near field patterns described in Japanese Patent Application Publication No. 10-65266 have drawbacks similar to those mentioned above. The near field patterns described in Japanese Patent Application No. 10-52941 are symmetrical although the light-emission apertures have different sizes. The combined laser field has a near field pattern or beam profile that has an output reduced portion in the center and cannot eliminate the above-mentioned drawbacks.

SUMMARY OF THE INVENTION

The present invention has been made in view of the above circumstances and provides a surface emitting semiconductor laser array and optical transmission system using the same.

According to an aspect of the present invention, there is provided a surface emitting semiconductor laser array comprising multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a near field pattern different from those of other light-emitting portions.

According to another aspect of the present invention, there is provided a surface emitting semiconductor laser array comprising multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a light-emission aperture having a center that is displaced from an oxidization-based aperture in the current funneling portion.

According to yet another aspect of the present invention, there is provided a module comprising: a semiconductor chip on which a surface emitting semiconductor laser array is mounted, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a near field pattern different from those of other light-emitting portions.

According to a further aspect of the present invention, there is provided a module comprising: a semiconductor chip on which a surface emitting semiconductor laser array is mounted, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a light-emission aperture having a center that is displaced from an oxidization-based aperture in the current funneling portion.

According to a still further aspect of the present invention, there is provided a surface emitting semiconductor laser device comprising: a module having a semiconductor chip on which a surface emitting semiconductor laser array is mounted; and a driver circuit supplying the surface emitting semiconductor laser array with a drive signal, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a near field pattern different from those of other light-emitting portions.

According to another aspect of the present invention, there is provided a surface emitting semiconductor laser device comprising: a module having a semiconductor chip on which a surface emitting semiconductor laser array is mounted; and a driver circuit supplying the surface emitting semiconductor laser array with a drive signal, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a light-emission aperture having a center that is displaced from an oxidization-based aperture in the current funneling portion.

According to another aspect of the present invention, there is provided an optical transmission apparatus comprising: a module having a semiconductor chip on which a surface emitting semiconductor laser array is mounted; and a transmission unit transmitting laser light emitted from the surface emitting semiconductor laser array, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a near field pattern different from those of other light-emitting portions.

According to a further aspect of the present invention, there is provided an optical transmission apparatus comprising: a module having a semiconductor chip on which a surface emitting semiconductor laser array is mounted; and a transmission unit transmitting laser light emitted from the surface emitting semiconductor laser array, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a light-emission aperture having a center that is displaced from an oxidization-based aperture in the current funneling portion.

According to a still further aspect of the present invention, there is provided an optical transmission system comprising: a module having a semiconductor chip on which a surface emitting semiconductor laser array is mounted; and a transmission unit transmitting laser light emitted from the surface emitting semiconductor laser array, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a near field pattern different from those of other light-emitting portions.

According to a still further aspect of the present invention, there is provided an optical transmission system comprising: a module having a semiconductor chip on which a surface emitting semiconductor laser array is mounted; and a transmission unit transmitting laser light emitted from the surface emitting semiconductor laser array, the surface emitting semiconductor laser array including: multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a light-emission aperture having a center that is displaced from an oxidization-based aperture in the current funneling portion.

BRIEF DESCRIPTION OF THE DRAWINGS

Preferred embodiments of the present invention will be described in detail based on the following figures, wherein:

FIG. 17A is a plan view of the optical transmission apparatus from which an upper portion is cut away from the apparatus;

FIG. 17B is a side view of the optical transmission apparatus from which a side portion is cut away from the apparatus;

DESCRIPTION OF THE PREFERRED EMBODIMENTS

Multi-spot type VCSELs according to embodiments of the present invention will be described with reference to the accompanying drawings.

Figure 1A:
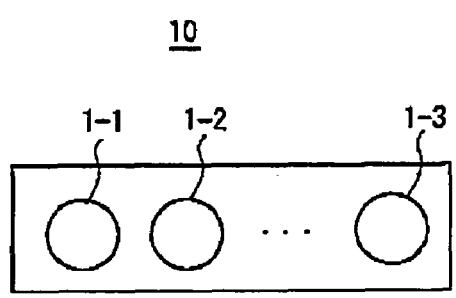
FIG. 1A is a plan view of a VCSEL array in which light-emitting portions are arranged in line.
Figure 1B:
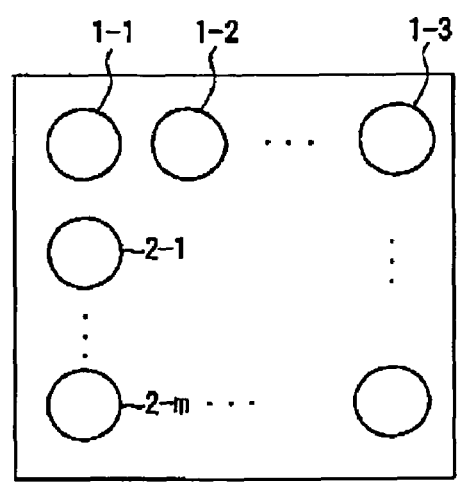
FIG. 1B is a plan view of a VCSEL array in which light-emitting portions are arranged in rows and columns.

FIGS. 1A and 1B schematically show plan views of VCSELs according to an embodiment of the present invention. More particularly, FIG. 1A shows a VCSEL array 10 in which light-emitting portions 1-1, 1-2, . . . , 1-$n$ ($n$ is an integer equal to or greater than 2) are arranged so as to form a one-dimensional array. FIG. 1B shows a two-dimensional VCSEL array 12 of m rows and n columns where m and n are integers equal to or greater than 2. The light-emitting portions are formed on a semiconductor substrate, as will be described later, and are simultaneously driven by a drive circuit. The laser beams simultaneously emitted from the light-emitting portions of the array are combined so that laser light with high power can be obtained.

Figure 2:
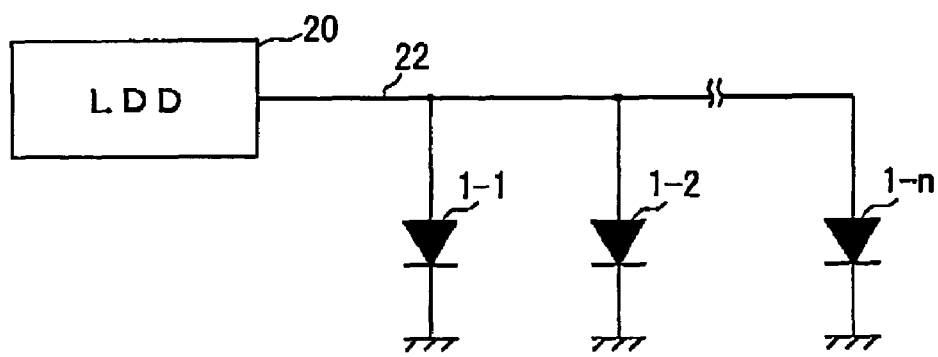
FIG. 2 is a circuit diagram of a drive circuit for a VCSEL array of a multi-spot type.

FIG. 2 shows a circuit diagram of a circuit that drives a VCSEL array of multi-spot type. As shown in FIG. 2, a laser diode driver (LDD) 20 receives a drive control signal from a microcomputer or the like, and a drive signal supplied to the light-emitting portions 1-1, 1-2, . . . , 1-$n$, which are driven by the drive signal, and emit laser beams. These laser beams are then combined into a single laser beam, which is applied to, for example, an optical fiber.

Figure 3:
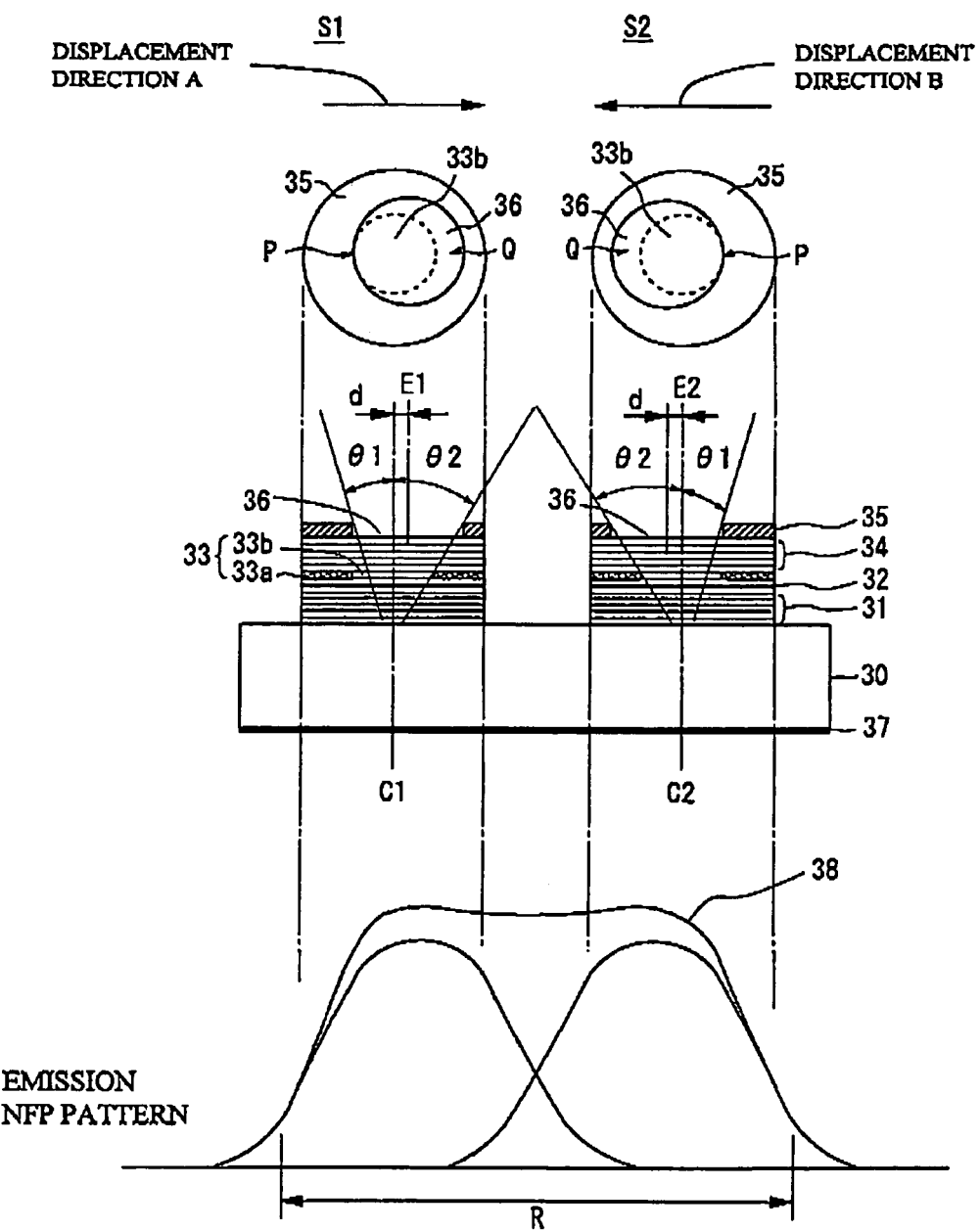
FIG. 3 shows a VCSEL array of the multi-spot type according to a first embodiment of the present invention.

FIG. 3 shows a cross-sectional view of light-emitting portions of the VCSEL array according to the present embodiment. Only two light-emitting portions are exemplarily illustrated in FIG. 3. Referring to FIG. 3, on an n-type semiconductor substrate 30, laminated are an n-type lower reflection mirror 31, an active region 32, a p-type current funneling portion 33, and a p-type upper reflection mirror 34. A p-side electrode layer 35 is provided on the laminate.

A light-emission aperture 36 is formed in the p-side electrode layer 35. An n-side electrode layer 37 is formed on the backside of the substrate 30. The p-type current funneling portion 33 serves as a current confinement region to confine currents.

Preferably, the two light-emitting portions S1 and S2 are formed in a cylindrical post or mesa on the substrate 30. Each post may be formed by etching so as to range from the upper reflection mirror 34 to a part of the lower reflection mirror 31. An oxidized region 33a defined by selective oxidization is formed in an outer peripheral circumference of each post so as to reflect the shape of the post. The remaining region that is not oxidized defines an aperture 33b, which is an electrically conductive region having a circular shape.

The present VCSEL has a unique structure in which the axial centers E1 and E2 of the light-emission apertures 36 formed in the p-side electrode layers 35 of the posts deviate, by a distance d, from the axial centers C1 and C2 of the oxidization-based apertures 33b. In other words, the light-emission aperture 36 of the light-emitting portion S1 is displaced towards the light-emitting portion S2 in a direction A, and the light-emission aperture 36 of the light-emitting portion S2 is displaced towards the light-emitting portion S1 in a direction B. Preferably, a circumferential edge P of the light-emission aperture 36 coincides with that of the aperture 33b. Preferably, the displacement distance d is approximately equal to 20% of the maximum diameter of the aperture 33b. When the posts have cylindrical shapes, the axial centers of the posts substantially coincide with the centers of the apertures 33b.

The displacement of the light-emission apertures 36 cause the laser lights emitted from the active regions 32 to be reflected inwards by the circumferential edges P of the light-emission apertures 36, so that emission of lights can be facilitated in circumferential edges Q opposite to the circumferential edges P. Thus, the laser light emitted from the light-emitting portion S1 has an asymmetrical near field pattern in which the laser light goes at a restricted angle θ1 on the edge-P side with respect to the axial center C1 of the post or the center of the oxidization-based aperture, and goes at a facilitated angle θ2 on the edge-Q side. In other words, the divergence angle θ2 defines a near field pattern that is inclined towards the adjacent light-emitting portion S2. The laser light emitted from the light-emitting portion S2 has an asymmetrical near field pattern in which the divergence angle θ1 on the P-edge side is restricted and the divergence angle θ2 on the Q-edge side is facilitated.

Thus, the overlapping region of the beams emitted from the light-emitting portions S1 and S2 can be increased and the combined light in the center of the light-emitting portions S1 and S2 has increased intensity. A beam profile 38 of the combined laser beam is as shown in FIG. 3 in which the output decrease in the center can be suppressed. The radius R of the beam profile (the radius at an intensity equal to $1/e^2$ of the peak intensity) of the combined laser is smaller than that of the conventional beam profile shown in FIG. 2. It is thus possible to narrow down the divergence angle or the beam spot of the laser light emitted from the array.

The above-mentioned embodiment has the light-emission apertures provided in the p-side electrode layer, and the laser light is reflected by the back surface of the p-side electrode layer. The present invention is not limited to the above structure, and may have a light reflection layer by which the oscillated laser light is reflected so as to go towards the post. The displacement distance d of the light-emitting portion S1 is equal to that of the light-emitting portion S2. However, the displacement distances d of the light-emitting portions S1 and S2 may be different from each other.

Figure 4:
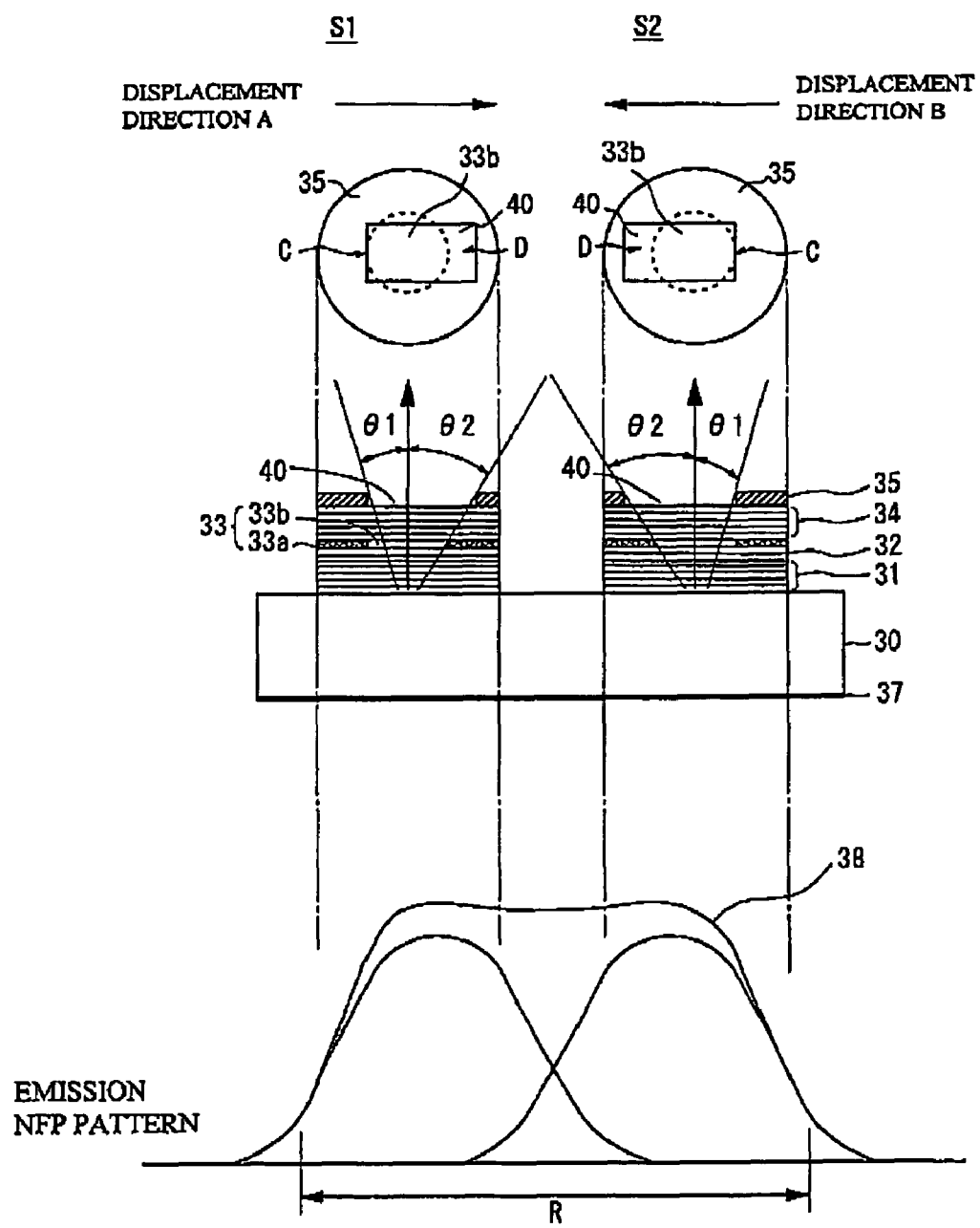
FIG. 4 shows a VCSEL array of the multi-spot type according to a second embodiment of the present invention.

A description will now be given of a second embodiment of the present invention. In the first embodiment, the light-emission apertures have a shape similar to that of the apertures defined by selective oxidization (those apertures have circles on the plan view). In contrast, the second embodiment employs light-emission apertures 40 having a rectangular shape, as shown in FIG. 4. Except the shape of the light-emission apertures 40, the second embodiment has the same structures as those of the first embodiment. Like the first embodiment, the second embodiment has the asymmetrical near field patterns displaced to close to each other, and the resultant beam profile 38 of the combined beam is such that the recess (power reduction) in the center is suppressed and the pattern radium R is narrowed.

Figure 5A:
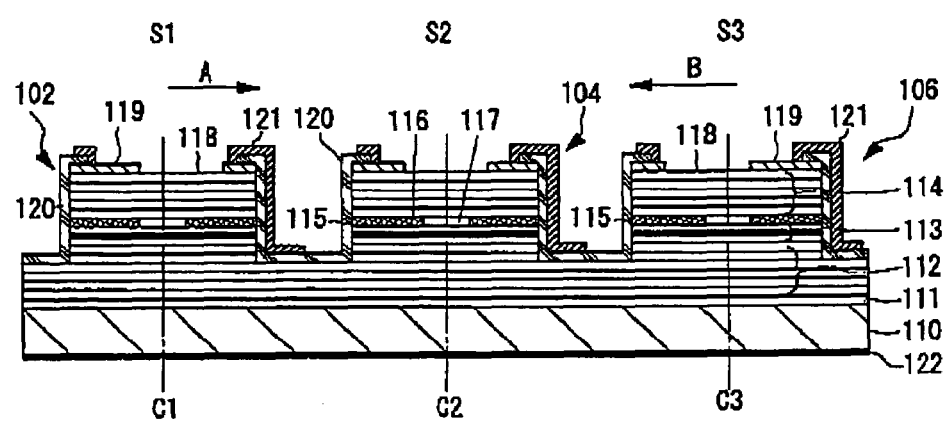
FIG. 5A is a cross-sectional view of a VCSEL array of the multi-spot type according to a third embodiment of the present invention.

A description will now be given of a third embodiment of the present invention. FIG. 5A is a cross-sectional view of a VCSEL array according to the third embodiment of the present invention. More specifically, FIG. 5A shows three light-emitting portions S1, S2 and S3 formed on a semiconductor substrate. The center of the light-emission aperture of the light-emitting portion S2 located in the center of the arrangement coincides with the axial center C2 of the post or the center of the aperture defined by selective oxidization. In contrast, the center of the light-emission aperture of the light-emitting portion S1 is displaced towards the light-emitting portion S2 from the center C1 of the oxidization-based aperture in the direction A, and the center of the light-emission aperture of the light-emitting portion S3 is displaced towards the light-emitting portion S2 from the center C3 of the oxidization-based aperture in the direction B.

A further description of the structure will be described below. A VCSEL array 50 of the multi-spot type has an n-type GaAs substrate 110 on which laminated are an n-type buffer layer 111, an n-type lower DBR (Distributed Bragg Reflector) layer 112, an active region 113, and a p-type upper DBR layer 114 in this order. The active region 113 has an undoped lower spacer layer, an undoped quantum well active layer and an undoped upper spacer layer. The semiconductor laminated on the semiconductor substrate 110 is anisotropically etched to a given depth so that posts 102, 104 and 106 can be formed on the substrate 110. The posts 102, 104 and 106 have a cylindrical shape and an approximately equal outer size.

The lowermost layer of the upper DBR layer 114 in each of the posts 102, 104 and 106 is a p-type AlAs layer 115. The uppermost layer of the upper DBR layer 114 may have a p-type contact layer. The AlAs layer 115 has an oxidized region 116 defined by selectively oxidizing each of the posts 102, 104 and 106 from the side surface thereof, and a circular oxidization-based aperture (electrically conductive region) 117 surrounded by the oxidized region 116. The AlAs layer 115 in each of the post 102, 104 and 106 functions as a current funneling portion that confines light and carrier. The oxidization-based apertures 117 of the posts 102, 104 and 106 have an equal diameter, and may, for example, be approximately 12 μm. The diameters of the oxidization-based apertures are measured on the plane parallel to the main surface of the substrate.

Patterned contact metals 119 having circular light-emission apertures 118 are formed on the tops of the posts 102, 104 and 106. The upper and side surfaces of the posts 102, 104 and 106 are covered with interlayer insulation films 120 in which contact holes for exposing the contact metals 119 are formed. P-side electrode layers 121 are patterned so as to enter the contact holes in the interlayer insulation films 120. An n-side electrode 122 is formed on the backside of the substrate 110.

In the post 102 of the light-emitting portion S1, the light-emission aperture 118 of the contact metal 119 is offset towards the light-emitting portion S2 from the axial center C1 of the oxidization-based aperture 117 in the direction A. In the post 106 of the light-emitting portion S3, the light-emission aperture 118 of the contact metal 119 is offset towards the light-emitting portion S2 from the axial center C3 of the oxidization-based aperture 117 in the direction B. In the post 104 of the light-emitting portion S2 located in the center, the center of the light-emission aperture 118 4 coincides with the axial center C2 of the oxidization-based aperture 117.

According to the third embodiment, the near field patterns of the laser lights from the light-emitting portions S1 and S3 located on the opposing sides are oriented towards the light-emitting portion S2 in the center, so that the divergence angle of the combined laser light can be narrowed down. Simultaneously, it is possible to prevent local power decrease on the bean profile.

Figure 5B:
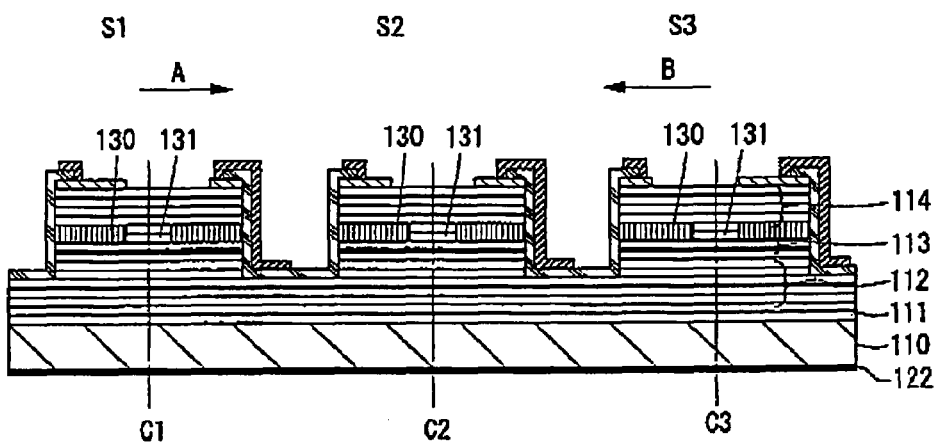
FIG. 5B is a cross-sectional view of a variation of the third embodiment.

The third embodiment employs the current funneling portion defined by selective oxidization of the AlAs layer. The present invention is not limited to the above, and may form an electrically conductive aperture 131 by forming a diffused region 130 by proton implantation, as shown in FIG. 5B. In this case, the posts or mesas of the light-emitting portions S1, S2 and S3 may be needed.

Figure 6A:
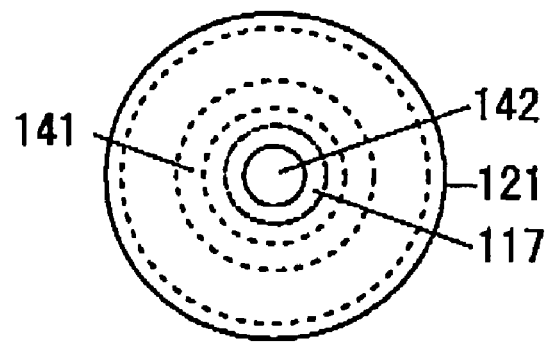
FIG. 6A is a plan view of a VCSEL array of the multi-spot type according to a fourth embodiment of the present invention.
Figure 6B:
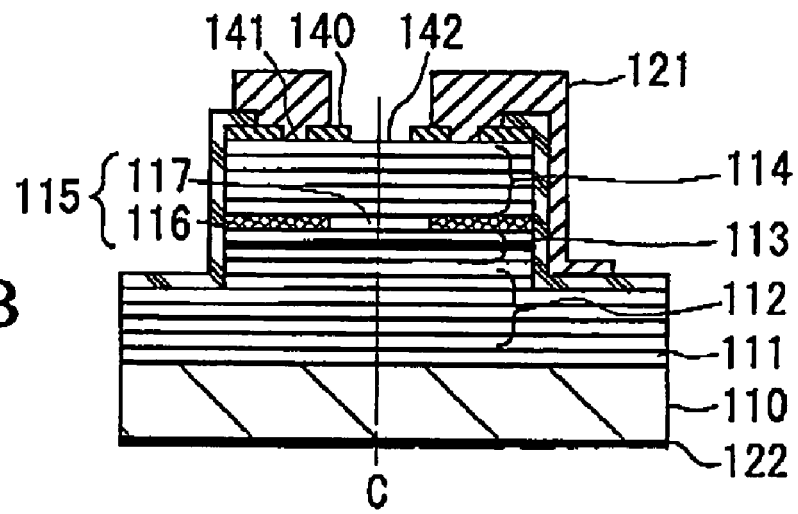
FIG. 6B is a cross-sectional view of the VCSEL array according to the fourth embodiment.

A description will now be given of a fourth embodiment of the present invention. The fourth embodiment employs a light-emission aperture in the light-emitting portion by means of a light reflection film. FIG. 6A is a plan view of a light-emitting portion used in the VCSEL array of the multi-spot type, and FIG. 6B is a cross-sectional view thereof. In FIGS. 6A and 6B, parts that are the same as those used in the third embodiment (FIGS. 5A and 5B) are given the same reference numerals. In the fourth embodiment, a single-layer or multi-layer reflection layer 140 is formed on the upper DBR layer 114 (which may include the p-type contact layer as the uppermost layer of the upper DBR layer 114). A contact hole 141 for exposing the upper DBR layer 114 is provided on the reflection film layer 140. The p-side electrode layer 121 is electrically connected to the upper DBR layer 114 via the contact hole 141.

A light-emission aperture 142 is formed in the center of the reflection film 140. The position of the light-emission aperture 142 may be displaced based on the position of the light-emitting portion of the array. FIGS. 6A and 6B show a case where the center of the light-emission aperture 142 coincides with the axial center of the post, namely, the center of the oxidization-based aperture 131. The reflection film 140 is used to adjust the position of the light-emission aperture 142 to reflect the laser light emitted in the post to the inside of the post. In this manner, the near field pattern of the light-emission aperture can be adjusted.

Figure 7:
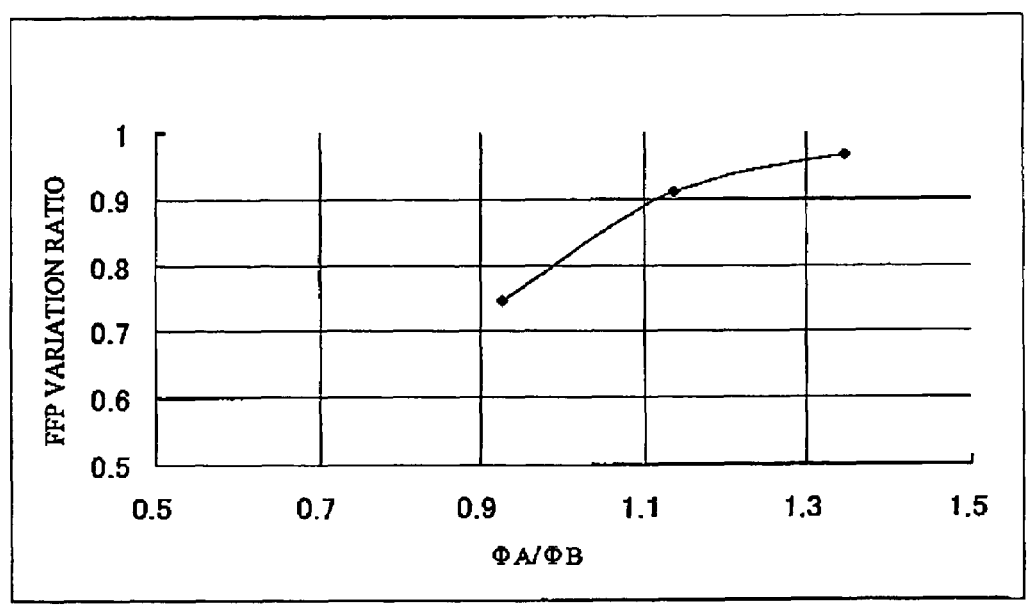
FIG. 7 shows experimental results of the FFP variation ratio as a function of the ratio of the diameter of a light-emission aperture in a contact metal to an oxidization-based aperture.

FIG. 7 shows experimental results that show an FFP (far field pattern) variation ratio as a function of the ratio of the diameter of the light-emitting aperture in the contact metal to the diameter of the oxidization-based aperture in the third embodiment. The horizontal axis denotes $\Phi A/\Phi B$ where $\Phi A$ is the diameter of the light-emission aperture in the contact metal and $\Phi B$ is the diameter of the oxidization-based aperture, and the vertical axis denotes the FFB variation ratio. FFP is the variation ratio of the radius at $1/e^2$ of the peak intensity. When the FFP variation ratio is 1, there is no change in FFP or the divergence angle. As the ratio $\Phi A/\Phi B$ increases, FFP changes more slowly and becomes close to 1. That is, as the diameter of the contact metal becomes great as compared to the diameter of the oxidization-based aperture, FFP changes more slowly. In light of the above, it is preferable to reduce $\Phi A/\Phi B$ and displace the near field pattern towards the center.

Figure 8:
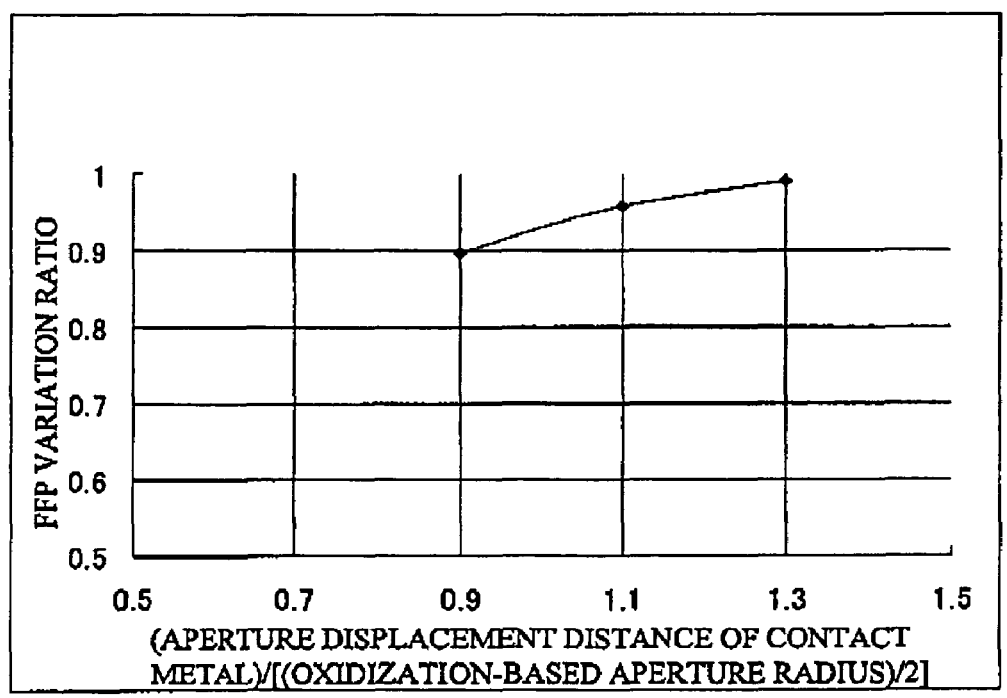
FIG. 8 shows experimental results of the variation ratio in FFP (divergence angle) observed when the center of the contact metal is displaced with respect to the oxidization-based aperture.

FIG. 8 shows experimental results of the variation ratio in FFP (divergence angle) observed when the center of the contact metal is displaced with respect to the oxidization-based aperture. The horizontal axis denotes the ratio of the displacement distance of the center of the contact metal to the radius of the oxidization-based aperture ($\Phi B/2$), and the vertical axis denotes the FFP variation ratio. The experimental results show that the displacement distance d to the radius of the oxidization-based aperture becomes great and close to 1.3, the FFP variation ratio becomes close to 1. Thus, it is preferable that the ratio of the displacement distance d to the radius of the oxidization-based aperture is equal to or less than 1.1. That is, the displacement distance d is preferably equal to or less than approximately 20%.

A description will now be given of a method of fabricating the VCSEL array according to the third embodiment of the present invention. The n-type GaAs buffer layer 111 is laminated to a thickness of about 0.2 μm on the n-type GaAs substrate 110 at a carrier concentration of $1\times10^{18}$ cm$^3$by MOCVD (Metal Organic Chemical Vapor Deposition). Next, the lower n-type DBR layer 112 is formed on the buffer layer 111 in which an $Al_{0.9}Ga_{0.1}As$ layer and $Al_{0.3}Ga_{0.7}As$ layer are alternately laminated to periods of 40.5. Each of the $Al_{0.9}Ga_{0.1}As$ layers and $Al_{0.3}Ga_{0.7}As$ layers has a thickness $\lambda/4$ nr where $\lambda$ is the oscillation frequency and nr is the refractive index of a medium. The lower n-type DBR layer 112 has a carrier concentration of $1\times10^{18}$ cm$^3$. The active region 113 is formed on the lower n-type DBR layer 112. The active region 113 is composed of an undoped lower $Al_{0.5}Ga_{0.5}As$ spacer layer, an undoped quantum well active layer, and an upper undoped $Al_{0.5}Ga_{0.5}As$ layer.

The upper DBR layer 114 is formed on the active region 113 so that an $Al_{0.9}Ga_{0.1}As$ layer and $Al_{0.3}Ga_{0.7}As$ layer are alternately laminated to periods of 30. Each of the $Al_{0.9}Ga_{0.1}As$ layers and $Al_{0.3}Ga_{0.7}As$ layers has a thickness equal to ¼ of the wavelength in the medium. The upper n-type DBR layer 114 has a carrier concentration of $1\times10^{18}$ cm$^{-3}$. The lowermost layer of the upper p-type DBR layer 113 includes the low-resistance p-type AlAs layer 115. The p-type contact layer is deposited as the uppermost layer of the upper DBR layer 114, to a thickness of about 10 nm at a carrier concentration of $1\times10^{19}$ cm$^{-3}$.

The posts 102, 104 and 106 are defined by etching the laminate up to a part of the lower n-type DBR layer 112 by reactive ion etching with a given mask. This results in the circular or rectangular posts 102, 104 and 106 having an identical outer diameter. The posts 102 and 104 and 106 may be arranged at intervals of approximately 50 μm.

The current funneling portions in the posts 102, 104 and 106 are defined by an oxidization process. During the oxidization process, AlGaAs having a high Al composition and AlAs having a high Al composition are changed to aluminum oxide ($Al_xO_y$). However, AlAs is oxidized much faster than AlGaAs. Thus, oxidization of only AlAs selectively progresses towards the post center from the post sidewall. Finally, the oxidized region 116 that reflects the outer shape of the mesa is formed. The oxidization-based aperture (electrically conductive region) surrounded by the oxidized region 116 in each post may have an approximately equal diameter. The oxidized region 117 in each post has reduced conductivity and is thus a current confinement portion. The current confinement portion has an optical refractive index (~1.6) as half as these of the peripheral semiconductor layers, and functions as a light confinement region. Therefore, the carrier and light are confined within the oxidization-based aperture 117.

The bottom, side and part of the top of each post are covered with the interlayer insulation film 120, which may be made of SiN or SiON. The p-side electrode layer 121 may be made of Au. The n-side electrode 122 on the backside of the substrate may be Au/Ge.

Figure 9:
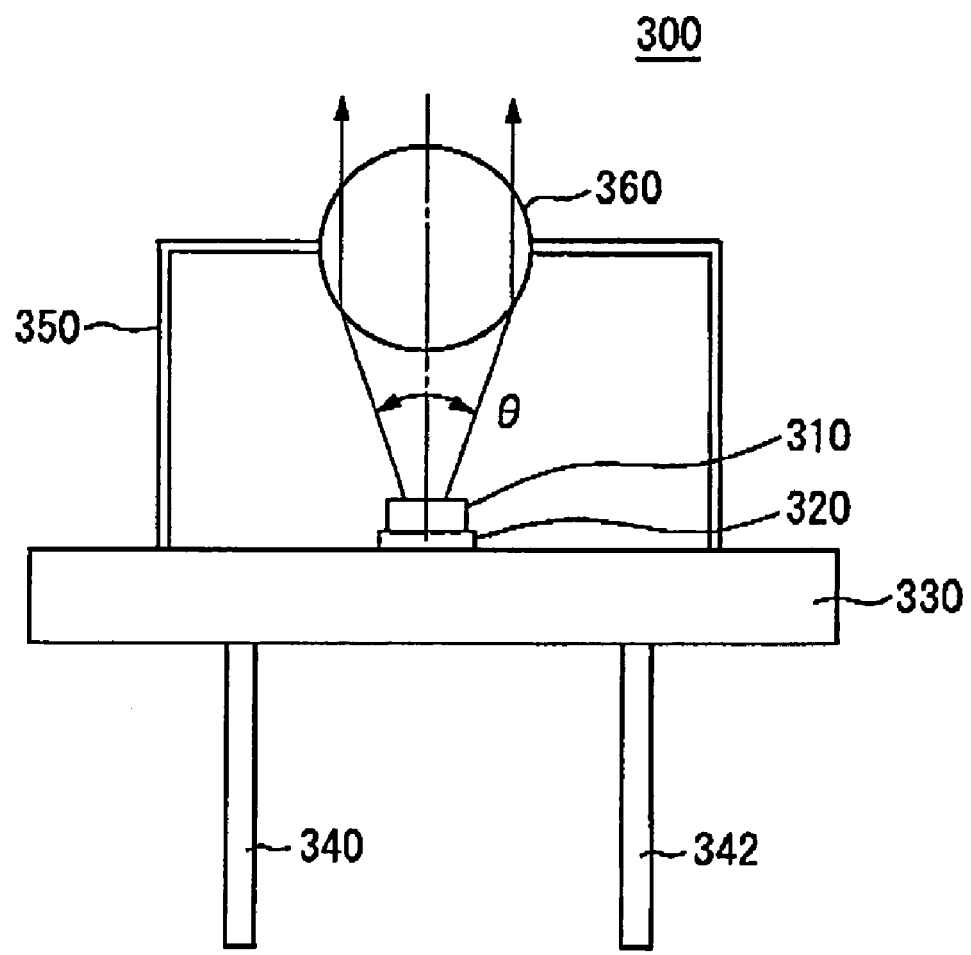
FIG. 9 is a schematic cross-sectional view of a package module in which a semiconductor chip on which the VCSEL array of the multi-spot type is mounted is incorporated.

FIG. 9 is a cross-sectional view of a module in which a semiconductor chip having a VCSEL array of the multi-spot type is incorporated. Referring to FIG. 9, a package 300 has a chip 310 including a VCSEL array of the multi-spot type, which chip is placed on and fixed to a disk-like metal stem 330 by an electrically conductive submount 320. Leads 340 and 342 are inserted into holes (not shown) formed in the step 330. The lead 340 is electrically connected to the n-side electrode formed on the backside of the chip 310, and the lead 342 is electrically connected to the p-side electrode formed on the main surface of the chip 310 by a bonding wire or the like.

A rectangular hollow cap 350 is fixed to the stem 330 equipped with the chip 310. A ball lens 360 is fixed to the cap 350 so as to be inserted into an opening formed in the center of the cap 350. The optical axis of the ball lens 360 is positioned so as to substantially coincide with the center of the chip 310. When a forward voltage is applied between the leads 340 and 342, laser lights are emitted from the mesas of the chip 310. The distance between the chip 310 and the ball lens 360 is adjusted so that the ball lens 360 is included in the radiation angle θ of the laser beams from the chip 310. A light receiving element for monitoring the emission condition of the VCSEL may be included in the cap 350.

Figure 10:
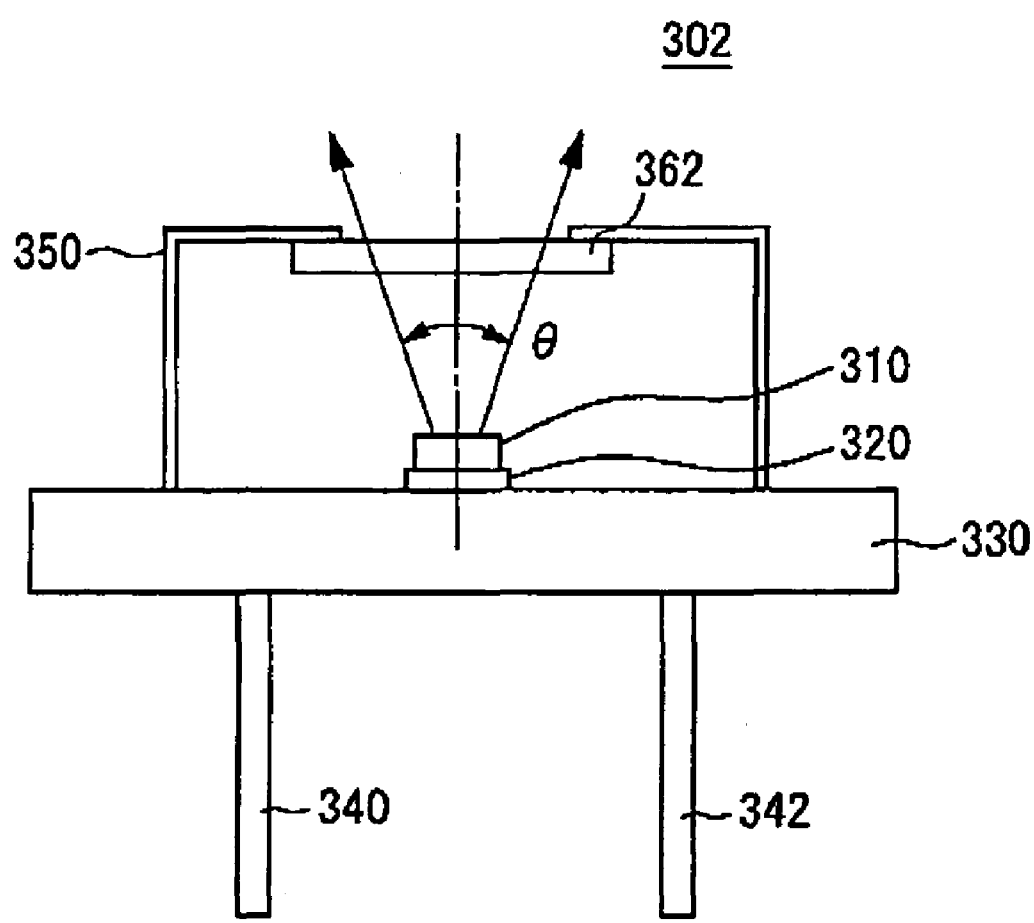
FIG. 10 is a schematic cross-sectional view of another package module.

FIG. 10 shows another module in which the semiconductor chip is packaged. A package 302 has a flat-plate glass 362, which is substituted for the ball lens 360 and fixed so as to cover the opening in the center of the cap 350. The center of the flat-plate glass 362 is positioned so as to substantially coincide with the center of the array on the chip in which the light-emitting portions are arranged in rows and columns. When the forward voltage is applied between the leads 340 and 342, the laser lights are emitted from the light-emitting portions on the chip 310. The distance between the chip 310 and the flat-plate glass 362 is adjusted so that the aperture diameter of the flat-plate glass 362 is equal to or greater than the divergence angle θ of the laser beams. The package may be suitably applied to free space optical transmission systems, as will be described later.

Figure 11:
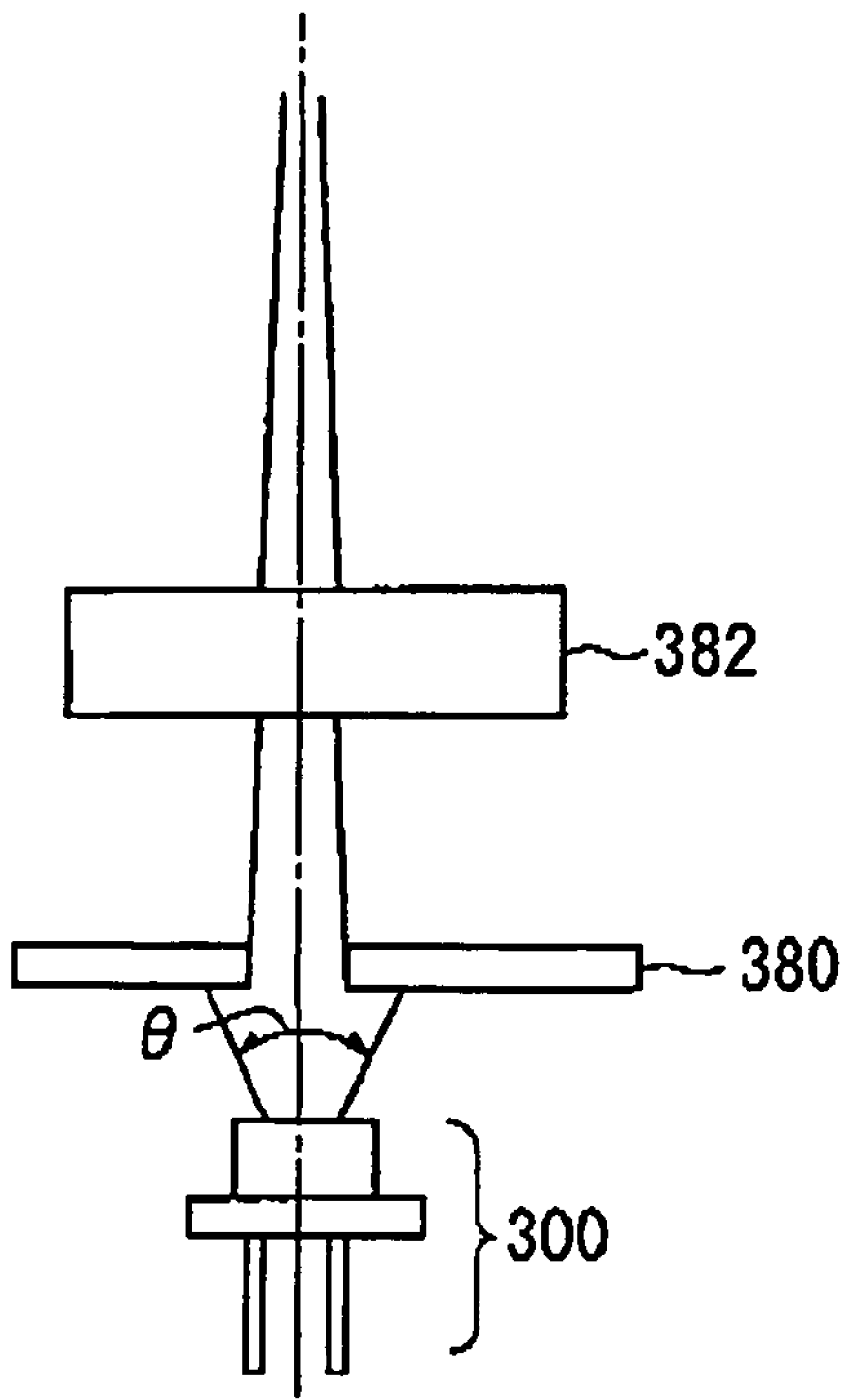
FIG. 11 is a schematic cross-sectional view of a slit-condensing lens system to which the VCSEL array of any of the embodiments is applied.

FIG. 11 shows a slit-light condensing lens system to which the package shown in FIG. 9 or FIG. 10 is applied. The combined laser light is emitted at the divergence angle θ from the upper surface of the package 300 including the VCSEL array. The laser light at the divergence angle θ passes through the slit 380 at which the spot size is narrowed, and enters into the condensing lens 390. It is thus possible to realize high-power optical transmission with the reduced beam size.

Figure 12:
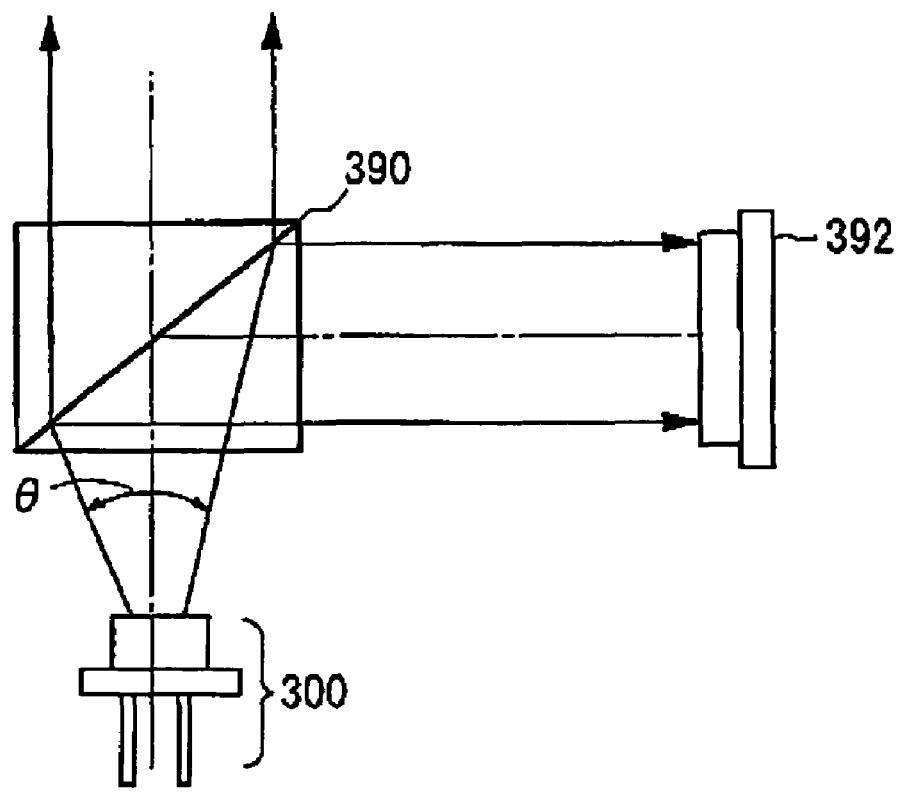
FIG. 12 shows a beam splitter-photodiode incident system to which the VCSEL array of any of the embodiments is applied.

FIG. 12 shows a beam splitter-photodiode optical incident system to which the package shown in FIG. 9 or FIG. 10 is applied. The laser light emitted from the upper surface of the package 300 at the divergence angle θ is incident to a beam splitter 390 or half-mirror, and a part of the laser light is incident to a photodiode 392. The system shown in FIG. 12 may be applied to an optical system for monitoring the amount of laser light of the VCSEL.

Figure 13:
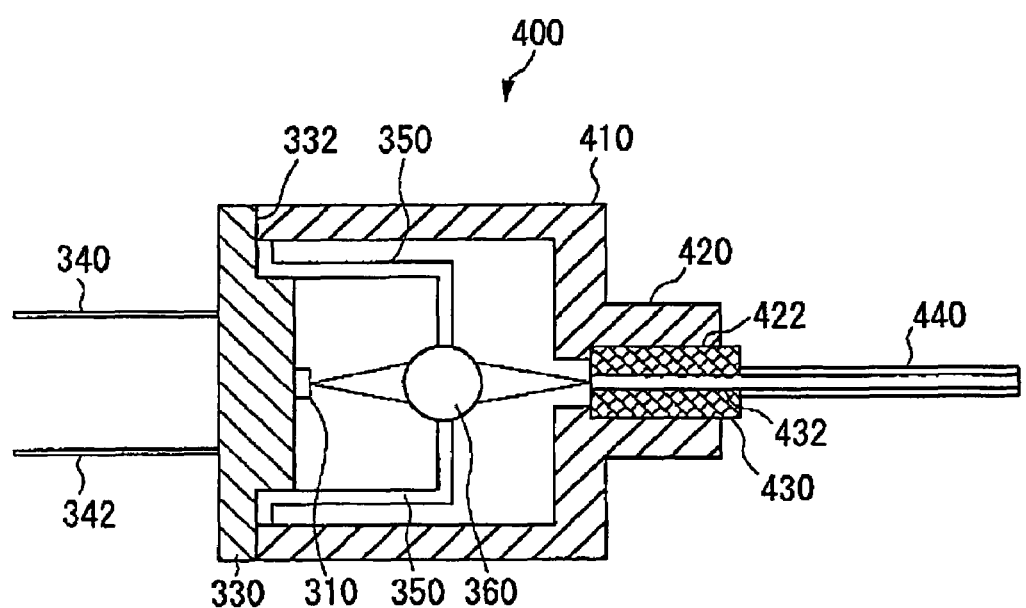
FIG. 13 is a cross-sectional view of an optical transmission apparatus to which the package shown in FIG. 8 is applied.

FIG. 13 is a cross-sectional view of an optical transmission apparatus to which the package or module shown in FIG. 9 is applied. An optical transmission apparatus 400 includes a housing 410, a sleeve 420, a ferrule 430 and an optical fiber 440. The housing 410 is fixed to the step 330. The sleeve 420 is integrally formed with an end surface of the housing 410. The ferrule 430 is held in an opening 422 of the sleeve 420. The optical fiber 440 is held by the ferrule 430.

An end of the housing 410 is fixed to a flange 332 formed in the circumferential direction of the step 330. The ferrule 430 is precisely positioned to the opening 422 of the sleeve 420, and optical axis of the optical fiber 440 is aligned with the optical axis of the ball lens 360. The core line of the optical fiber 440 is held in a through hole 432 of the ferrule 430.

The laser light emitted from the surface of the chip 310 is condensed by the ball lens 360, and the condensed light is incident to the core line of the optical fiber 440 for transmission. The ball lens 360 may be replaced by a double-convex lens, a flat-convex lens or another lens. The optical transmission apparatus 400 may include a drive circuit that processes the electric signal applied between the leads 340 and 342. The optical transmission apparatus 400 may have the function of receiving an optical signal transmitted over the optical fiber 440.

Figure 14:
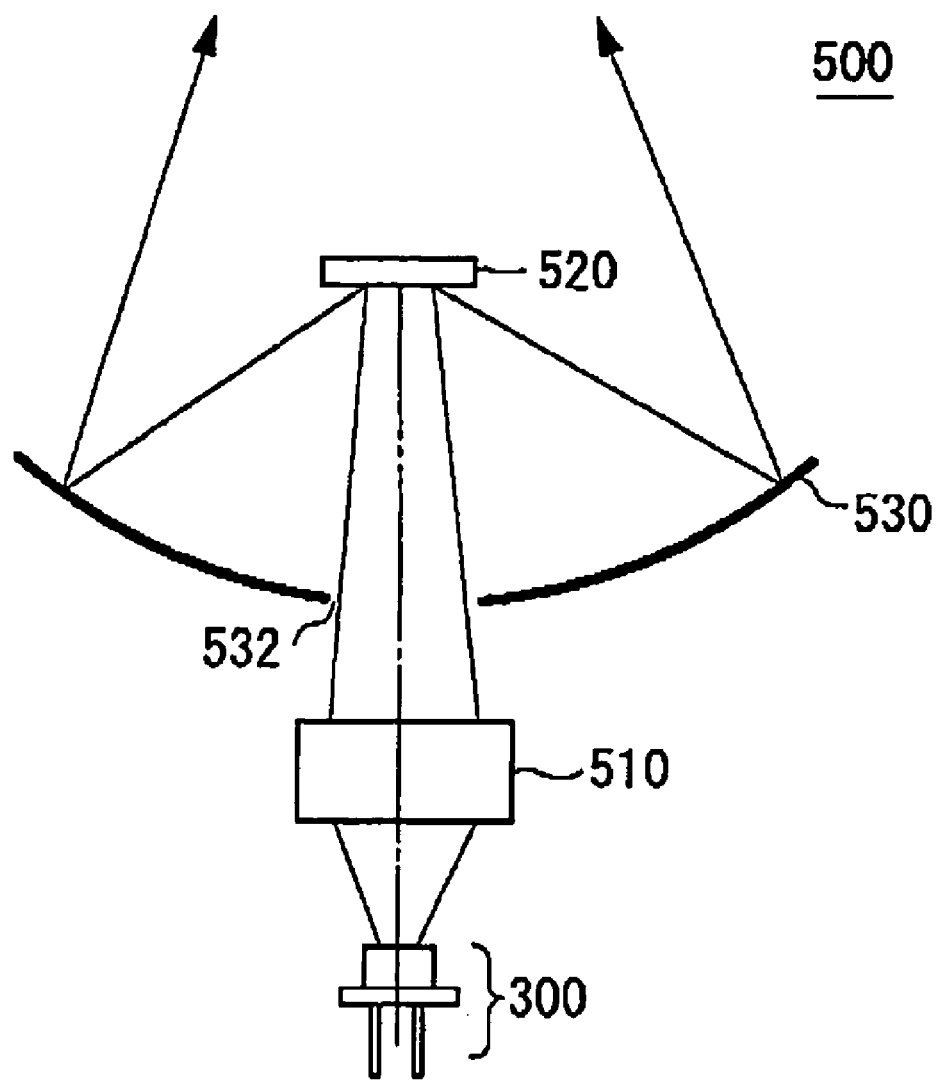
FIG. 14 shows a free space optical transmission system to which the package shown in FIG. 9 is applied.

FIG. 14 shows a structure in which the package shown in FIG. 9 is applied to a free space optical transmission system. A free space optical transmission system 500 includes the package 300, a condense lens 510, a diffusion plate 520 and a reflection mirror 530. The free space optical transmission system 500 employs the condense lens 510 instead of the ball lens 360 used in the package 300. The light condensed by the condense lens 510 is reflected by the diffusion plate 520 via an opening 532 of the reflection mirror 530, and goes towards the reflection mirror 520. The reflection mirror 520 reflects the incident light in a given direction for optical transmission. The use of the VCSEL array of the multi-spot type according to the present invention realizes optical transmission with the high-power, single peak laser beam.

Figure 15:
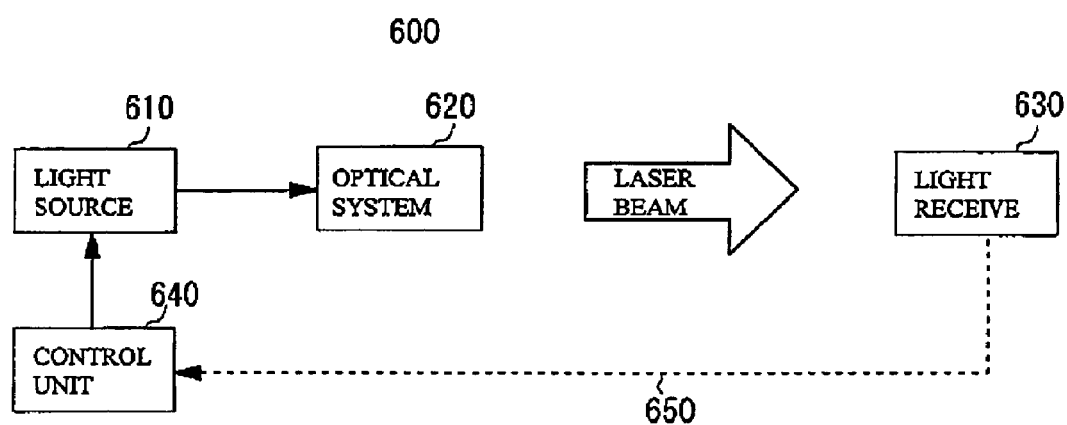
FIG. 15 is a block diagram of an optical transmission system.

FIG. 15 shows an optical transmission system to which the VCSEL array is applied. An optical transmission system 600 includes a light source 620, an optical system 620, a light-receiving unit 630, and a control unit 640. The light source 610 includes the chip 310 on which the VCSEL array of the multi-spot type is formed. The optical system 620 condenses the laser beam emitted from the light source 610. The light-receiving unit 630 receives the laser beam output from the optical system 620. The control unit 640 controls driving the light source 610. The control unit 640 supplies the light source 610 with a drive pulse signal for driving the VCSEL array. The light emitted from the light source. 610 is guided to the light-receiving unit 630 via the optical system 620 by an optical fiber and a reflection mirror for free space optical transmission. The light-receiving unit 630 detects the received light by a photodetector or the like. The light-receiving unit 630 can control the operation (for example, the start timing of optical transmission) of the control unit 640 in response to a control signal 650. The VCSEL array of the multi-spot type according to the present invention realizes the beam profile no considerable output decrease over the whole region. This makes it possible for the light-receiving unit 630 to appropriately detect the laser light in any position of the range.

Figure 16:
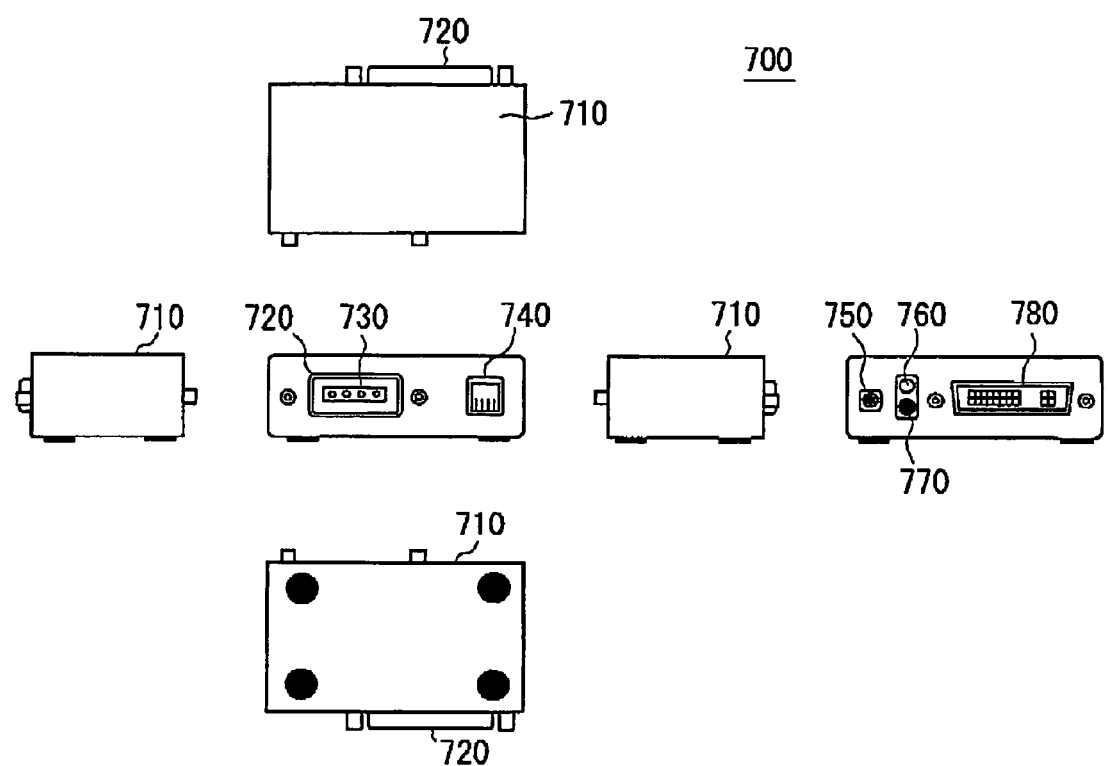
FIG. 16 shows an outer appearance of an optical transmission apparatus.

A description will now be given of an optical transmission apparatus used for the optical transmission system. FIG. 16 shows the outer appearance of the optical transmission apparatus, and FIGS. 17A and 17B show an internal structure thereof. An optical transmission apparatus 700 includes a casing 710, an optical signal transmission/reception connector joint unit 720, a light-emitting/light-receiving element 730, an electric signal cable joint unit 740, a power input unit 750, an LED 760 indicative of in-operation, an LED 770 indicative of error, a DVI connector 780 and a transmission circuit board/reception circuit board 790.

Figure 18:
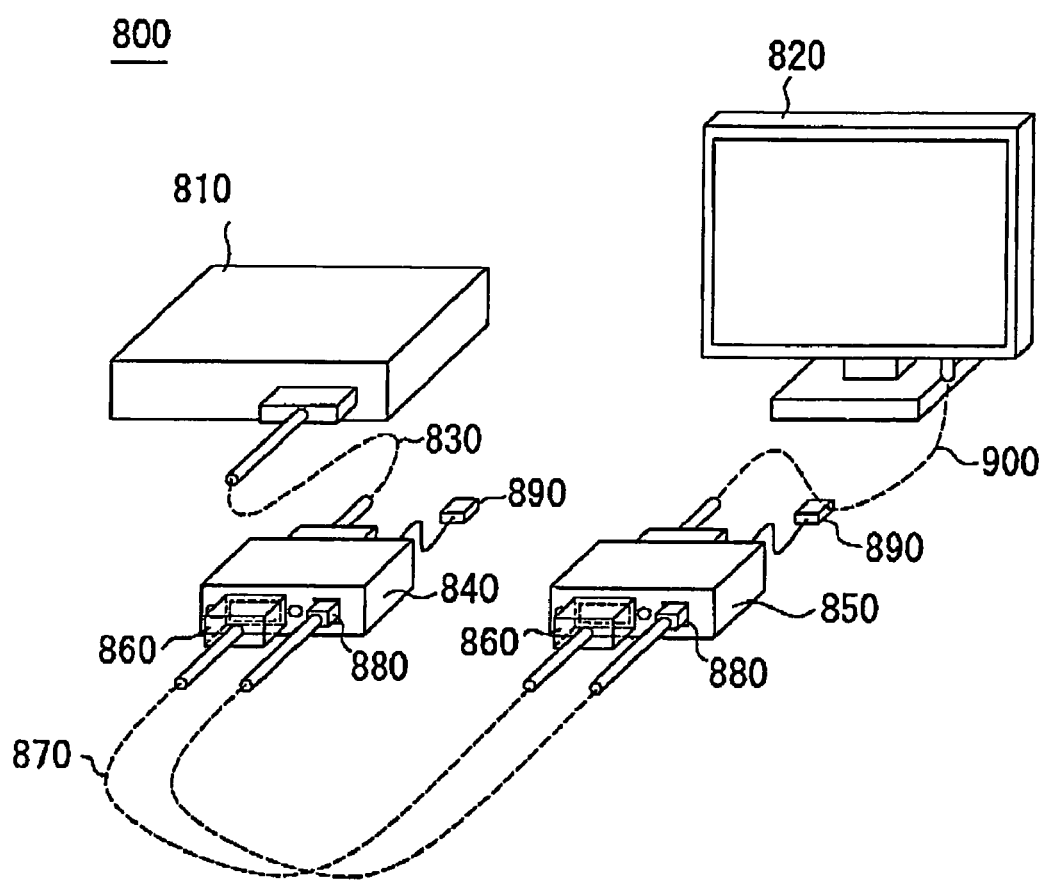
FIG. 18 shows a video transmission system to which the optical transmission system shown in FIG. 15 is applied.
Figure 19:
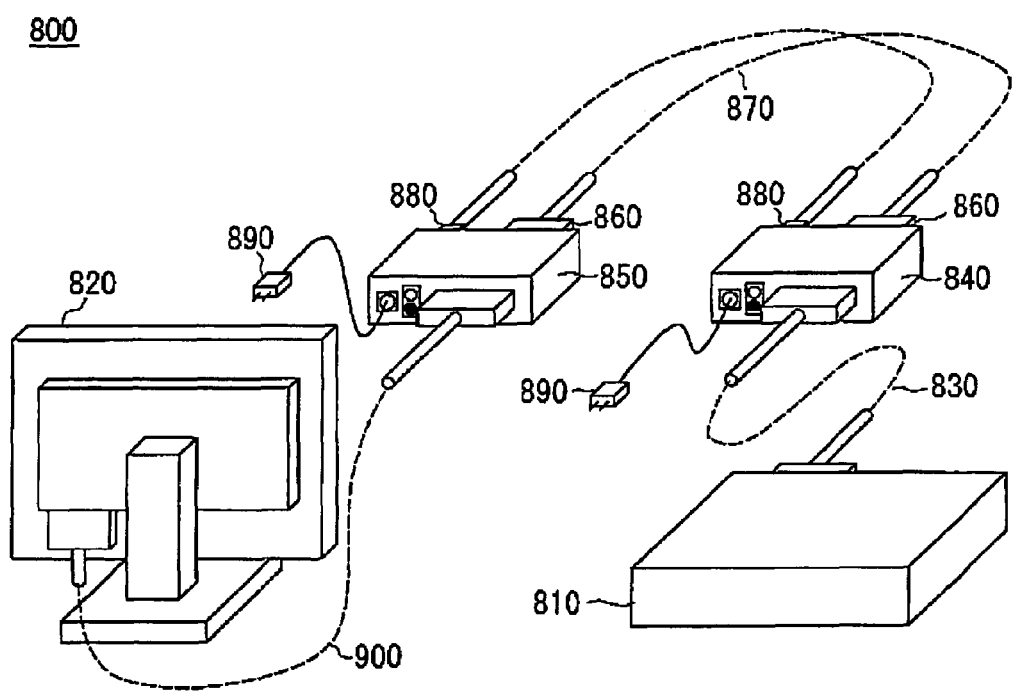
FIG. 19 shows the video transmission system viewed from the backside.
Figure 20:
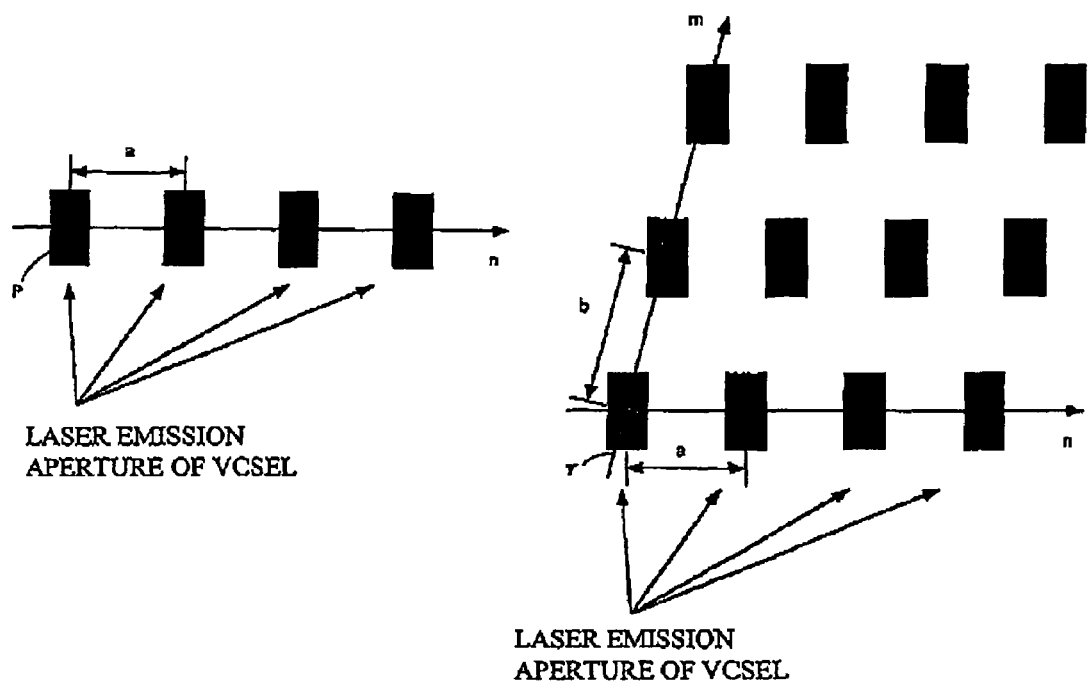
FIG. 20 shows a light-emission pattern of a conventional VCSEL of the multi-spot type.
Figure 21:
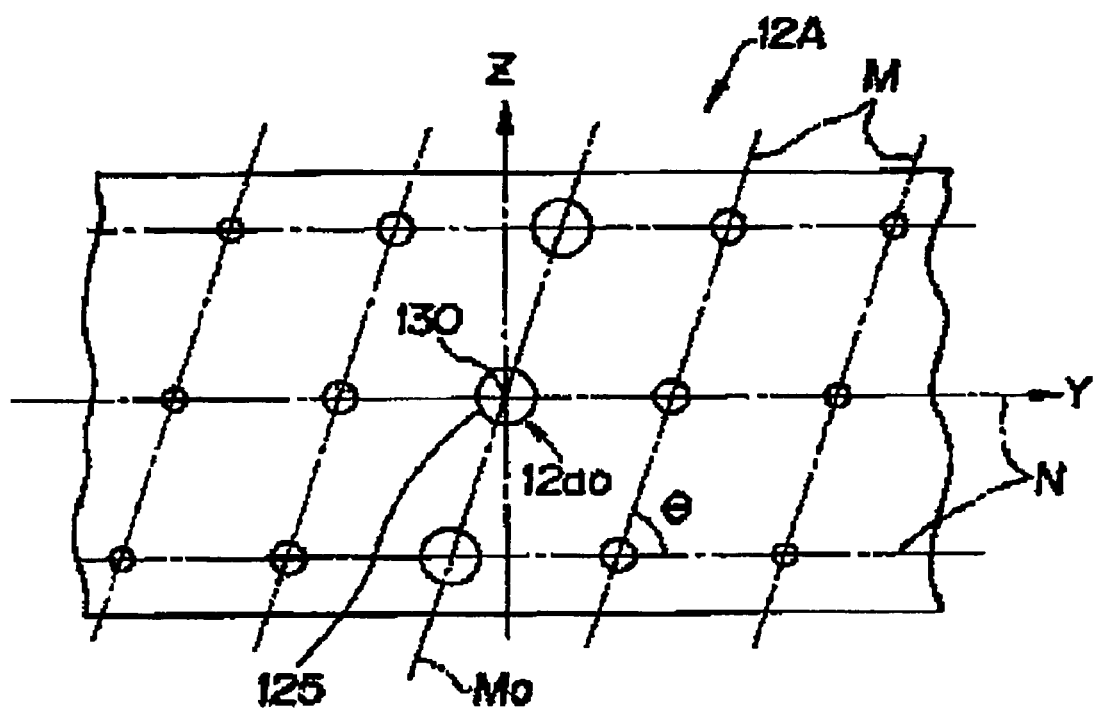
FIG. 21 shows light-emission apertures of the conventional VCSEL of the multi-spot type.
Figure 22:
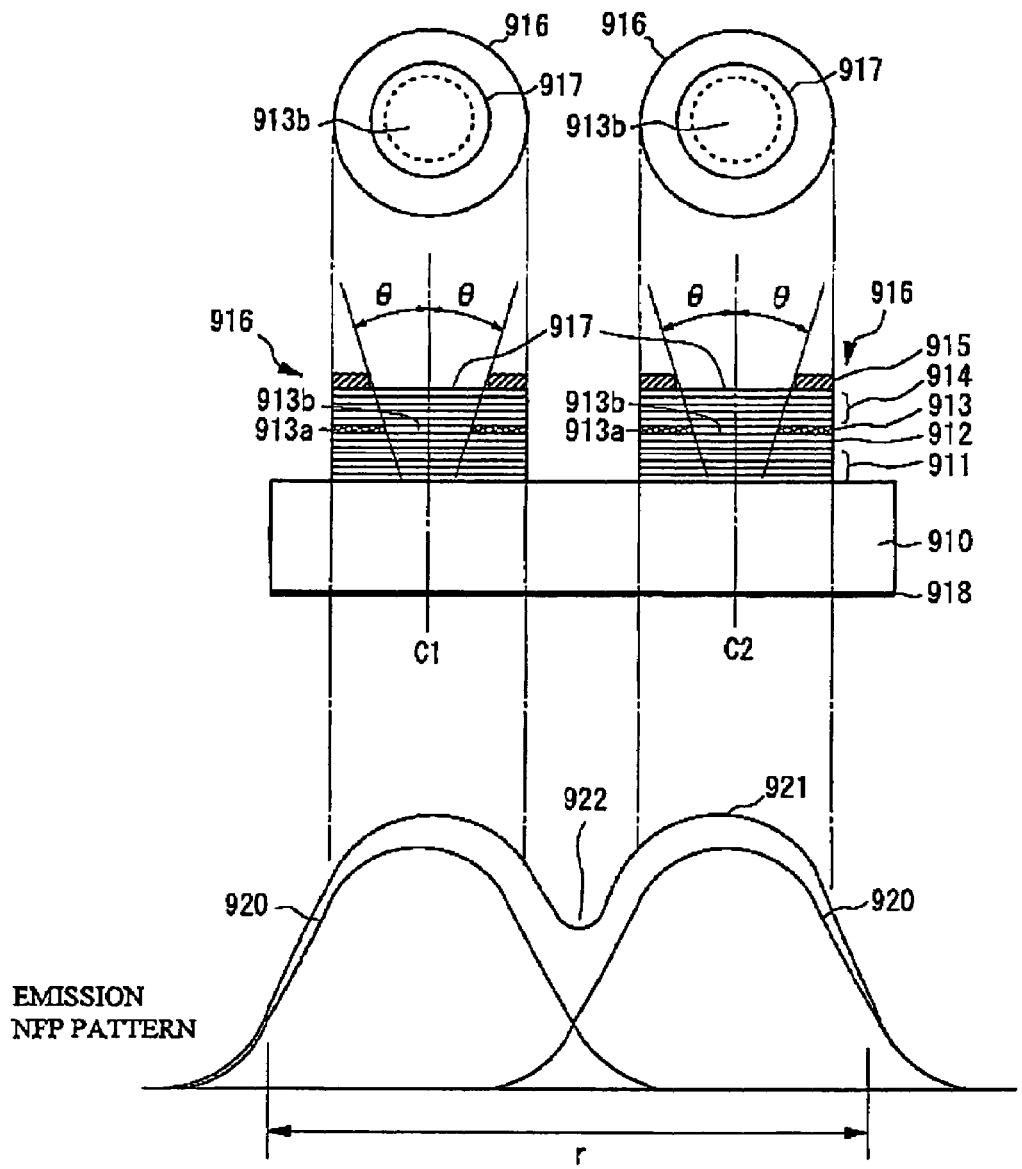
FIG. 22 shows drawbacks of the conventional VCSEL of the multi-spot type.

A video transmission system equipped with the optical transmission apparatus 700 is illustrated in FIGS. 18 and 19. Referring to these figures, a video transmission system 800 is equipped with the optical transmission apparatus shown in FIGS. 16 and 17 for transmitting a video signal generated by a video signal generator 810 to an image display device 820 such as a liquid crystal display. The video transmission system 800 includes the video signal generator 810, the image display device 820, a DVI electrical cable 830, a transmission module 840, a reception module 850, an optical connector for video signal transmission, an optical fiber 870, an electrical cable connector 880 for use in control, a power adapter 890, and a DVI electrical cable 900.

In the above video transmission system, electric signals are used for transmission between the video signal generator 810 and the transmission module 840, and transmission between the reception module 850 and the video display device 820 by electrical cables 830 and 900. Instead of the electrical cables, optical transmission may be employed. For example, signal transmission cables having connectors equipped with an electro-optical converter and an opto-electrical converter may be substituted for the electrical cables 830 and 900. The control signal may be transmitted using a light signal over the optical fiber 870 or another optical fiber.

The surface emitting laser device of the multi-spot type according to the present invention is applicable to various fields including light sources of a printing machine and a copying machine, and those of optical networks.

The present invention is not limited to the specifically described embodiments, and variations and modifications may be made without departing from the scope of the claimed invention.

The present invention is based on Japanese Patent Application No. 2005-112405 filed on Apr. 8, 2005, the entire disclosure of which is hereby incorporated by reference.

What is claimed is:

1. A surface emitting semiconductor laser array comprising
multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions,
at least one of the multiple light-emitting portions having a plurality of electrodes that define a light-emission aperture having a center that is displaced from a center of an oxidization-based aperture in the current funneling portion.

2. The surface emitting semiconductor laser array as claimed in claim 1, wherein said at least one of the multiple light-emitting portions is located at an end of the array.

3. The surface emitting semiconductor laser array as claimed in claim 1, wherein centers of light-emitting portions among the multiple light-emitting portions located at an end of the array is displaced from centers of oxidization-based apertures towards a center of the array.

4. The surface emitting semiconductor laser array as claimed in claim 1, wherein:
the multiple light-emitting portions include posts formed on the substrate;
the light-emission aperture is formed on a top of each of the posts; and
an oxidization-based aperture is formed in the current funneling portion in each of the posts.

5. The surface emitting semiconductor laser array as claimed in claim 4, wherein the current funneling portion includes an AlAs layer, and the oxidization-based aperture is formed by selective oxidization of the AlAs layer from a side surface of each of the posts.

6. The surface emitting semiconductor laser array as claimed in claim 1, wherein the light-emission aperture is formed in an electrode layer via which current is injected to a corresponding one of the multiple light-emitting portions.

7. The surface emitting semiconductor laser array as claimed in claim 1, wherein the light-emission aperture includes one of a single layer and a multi-layer reflection film.

8. The surface emitting semiconductor laser array as claimed in claim 1, wherein the laser beams emitted from the multiple light-emitting portions are combined into a single light signal.

9. A module comprising:
a semiconductor chip on which a surface emitting semiconductor laser array is mounted,
the surface emitting semiconductor laser array including:
multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions,
at least one of the multiple light-emitting portions having a plurality electrodes that define a light-emission aperture having a center that is displaced from a center of an oxidization-based aperture in the current funneling portion.

10. A surface emitting semiconductor laser device comprising:
a module having a semiconductor chip on which a surface emitting semiconductor laser array is mounted; and
a driver circuit supplying the surface emitting semiconductor laser array with a drive signal,
the surface emitting semiconductor laser array including:
multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions,
at least one of the multiple light-emitting portions having a plurality of electrodes that a light-emission aperture having a center that is displaced from a center of an oxidization-based aperture in the current funneling portion.

11. An optical transmission apparatus comprising:

a module having a semiconductor chip on which a surface emitting semiconductor laser array is mounted; and a transmission unit transmitting laser light emitted from the surface emitting semiconductor laser array, the surface emitting semiconductor laser array including:

multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a plurality of electrodes that define a light-emission aperture having a center that is displaced from a center of an oxidization-based aperture in the current funneling portion.

12. The optical transmission apparatus as claimed in claim 11, wherein the transmission unit transmits the laser light using free space optical transmission.

13. An optical transmission system comprising:

a module having a semiconductor chip on which a surface emitting semiconductor laser array is mounted; and a transmission unit transmitting laser light emitted from the surface emitting semiconductor laser array, the surface emitting semiconductor laser array including:

multiple light-emitting portions arranged in a one-dimensional or two-dimensional array, each of the light-emitting portions including, on a substrate, an active region and a current funneling portion between first and second reflection mirrors, and a light-emission aperture above the second reflection mirror, laser beams being simultaneously emitted from the multiple light-emitting portions, at least one of the multiple light-emitting portions having a plurality of electrodes that define a light-emission aperture having a center that is displaced from a center an oxidization-based aperture in the current funneling portion.

14. The optical transmission system as claimed in claim 13, wherein the transmission unit transmits the laser light using free space optical transmission.

* * * * *